(12) United States Patent
Hong et al.

(10) Patent No.: US 11,426,678 B2
(45) Date of Patent: Aug. 30, 2022

(54) SUBLIMATION PURIFICATION APPARATUS AND SUBLIMATION PURIFICATION METHOD

(71) Applicant: LG CHEM, LTD., Seoul (KR)

(72) Inventors: Seok Kwang Hong, Daejeon (KR); Hyoung Seok Kim, Daejeon (KR); Hun Young Lee, Daejeon (KR); Kwang Jin Jeong, Daejeon (KR); Young Hwan Shin, Daejeon (KR)

(73) Assignee: LG CHEM, LTD., Seoul (KR)

( * ) Notice: Subject to any disclaimer, the term of this patent is extended or adjusted under 35 U.S.C. 154(b) by 173 days.

(21) Appl. No.: 16/968,365

(22) PCT Filed: Aug. 6, 2019

(86) PCT No.: PCT/KR2019/009812
§ 371 (c)(1),
(2) Date: Aug. 7, 2020

(87) PCT Pub. No.: WO2020/054974
PCT Pub. Date: Mar. 19, 2020

(65) Prior Publication Data
US 2020/0406163 A1 Dec. 31, 2020

(30) Foreign Application Priority Data

Sep. 12, 2018 (KR) .......................... 10-2018-0109089
Jun. 4, 2019 (KR) .......................... 10-2019-0066109

(51) Int. Cl.
*B01D 7/00* (2006.01)
*H01L 51/00* (2006.01)
*H01L 51/56* (2006.01)

(52) U.S. Cl.
CPC ............ *B01D 7/00* (2013.01); *H01L 51/0025* (2013.01); *H01L 51/56* (2013.01)

(58) Field of Classification Search
None
See application file for complete search history.

(56) References Cited

U.S. PATENT DOCUMENTS 5,236,739 A * 8/1993 Chou ................. B41M 5/38214
427/255.6
2009/0217980 A1* 9/2009 Pfeiffer .................. B82Y 10/00
136/263

(Continued)

FOREIGN PATENT DOCUMENTS

JP 2003-088704 3/2003
JP 2005-511864 4/2005

(Continued)

OTHER PUBLICATIONS

Machine translation of KR-100473154 (Year: 2002).*
Machine Translation of KR-10-2012-0061137 (Year: 2012).*

*Primary Examiner* — J. E. Schoenholtz
(74) *Attorney, Agent, or Firm* — Dentons US LLP

(57) ABSTRACT

A sublimation purification apparatus that includes a vacuum chamber; a tube housing positioned in the vacuum chamber; a boat in close contact with the tube housing; and heating units positioned adjacent to an outer surface of the boat and an outer surface of the tube housing, respectively, wherein a sublimation purification target material is contained in the boat, and at least one of the boat and the tube housing is formed of a metal.

18 Claims, 11 Drawing Sheets

(56) References Cited

U.S. PATENT DOCUMENTS

| | | | | |
|---|---|---|---|---|
| 2013/0216968 A1* | 8/2013 | Lee | ............................ | F27D 5/00 |
| | | | | 432/207 |
| 2016/0193543 A1 | 7/2016 | Kim et al. | | |
| 2019/0086790 A1* | 3/2019 | Aotake | .................... | C07F 5/022 |
| 2019/0115566 A1 | 4/2019 | Chi et al. | | |
| 2020/0083455 A1* | 3/2020 | Han | ......................... | B01D 46/62 |

FOREIGN PATENT DOCUMENTS

| | | | | |
|---|---|---|---|---|
| JP | 2006-265575 | | 10/2006 | |
| KR | 100473154 B1 | * | 12/2002 | ................ B01D 7/00 |
| KR | 10-2004-0009313 | | 1/2004 | |
| KR | 10-2004-0049365 | | 6/2004 | |
| KR | 10-2010-0045548 | | 5/2010 | |
| KR | 20120061137 A | * | 10/2010 | ................ B01D 7/00 |
| KR | 10-2012-0061137 | | 6/2012 | |
| KR | 10-2013-0076272 | | 7/2013 | |
| KR | 10-2013-0142386 | | 12/2013 | |
| KR | 10-2014-0079308 | | 6/2014 | |
| KR | 10-2014-0128676 | | 11/2014 | |
| KR | 10-2014-0146385 | | 12/2014 | |
| KR | 10-2015-0065515 | | 6/2015 | |
| KR | 10-2017-0136374 | | 12/2017 | |
| WO | 2003-051796 | | 6/2003 | |
| WO | 2013-065627 | | 5/2013 | |
| WO | 2013-145832 | | 10/2013 | |
| WO | 2013-145834 | | 10/2013 | |
| WO | 2015-084088 | | 6/2015 | |
| WO | 2015-146763 | | 10/2015 | |

* cited by examiner

< Prior Art >

< Prior Art >

SUBLIMATION PURIFICATION APPARATUS AND SUBLIMATION PURIFICATION METHOD

CROSS-REFERENCE TO RELATED APPLICATION(S)

This application is a National Stage Application of International Application No. PCT/KR2019/009812 filed on Aug. 6, 2019, which claims priority to and the benefit of Korean Patent Application No. 10-2018-0109089 filed in the Korean Intellectual Property Office on Sep. 12, 2018, and Korean Patent Application No. 10-2019-0066109 filed in the Korean Intellectual Property Office on Jun. 4, 2019, the entire contents of which are incorporated herein by reference.

TECHNICAL FIELD

The present invention relates to a sublimation purification apparatus and a sublimation purification method, and more particularly, to a sublimation purification apparatus and a sublimation purification method capable of implementing high-purity purification efficiency, yield improvement by a continuous process, and reduced production time.

BACKGROUND

An electroluminescent device is a self-light emitting device emitting phosphors via an electron-hole recombination, the purity of a light emitting layer material can be a factor influencing light emitting characteristics of the electroluminescent device, and in particular, in a case of an organic electroluminescent device, the purity of an organic material has a great influence on the light emitting characteristics of the device. When impurities are mixed in the organic material, the impurities serve as traps of carriers or cause the extinction of light, which causes significant reduction of light emitting intensity and light emission efficiency of the device. Therefore, there is a need to purify the organic material in order to remove the impurities.

As a method for purifying the organic material, a recrystallization method using a solvent or a recrystallization method by sublimation is typically used. In the case of the recrystallization method by sublimation, since the organic material is sublimated and recrystallized under vacuum, the impurities are not mixed in the organic material. A train-sublimation method is generally used in the purification for the organic material for an organic electroluminescent device. As shown in the principle view illustrated in FIG. 1, in such a method, when an organic material 6 containing a purified material and impurities is heated and vaporized in a first heating zone 1, gas molecules move in a pumping direction through a quartz tube 5, and at this time, the gas enter a second heating zone 2 and a third heating zone 3 having different temperature ranges and thus a phase thereof is changed to a liquid or a solid, thereby separately collecting a purified material 7 and impurities 8.

As illustrated in FIG. 2, a sublimation purification apparatus according to the related art includes a plurality of second quartz tubes 20 in a first quartz tube 10 for a vacuum state and a heater cover 30 provided with a ceramic heater 31 and formed on an outer side of the first quartz tube 10. When an organic material 51 is inserted into the sublimation purification apparatus, and then the ceramic heater 31 is heated after closing the heater cover 30, a purified material 52 and impurities 53 are separated due to a temperature difference in the sublimation apparatus.

In the sublimation purification apparatus, the first quartz tube 10 is used for a vacuum atmosphere or airtightness from the atmosphere, the second quartz tubes 20 are separated into several sections to be controlled by different temperatures, such that the impurities of the organic material 51 are removed, thereby obtaining the purified material 52. However, since quartz, which is a material of an inner part of the conventional sublimation purification apparatus, is limited in mass-production and thus it is difficult to have process continuity, use of quartz is disadvantageous in terms of reduction of yield and increase in manpower.

BRIEF DESCRIPTION

Technical Problem

The present invention has been made in an effort to provide a sublimation purification apparatus and a sublimation purification method capable of implementing continuous process automation, high-purity purification efficiency, yield improvement by a continuous process, and reduced production time by metallization of a material of an inner part of the sublimation purification apparatus to address the disadvantages of a conventional apparatus such as design processing limitation of quartz, which is the material of the inner part of the conventional sublimation purification apparatus, and poor durability.

However, the objects to be achieved by the exemplary embodiments of the present invention are not limited to the above-mentioned objects, but can be variously extended within the scope of the technical idea included in the present invention.

Technical Solution

An exemplary embodiment of the present invention provides a sublimation purification apparatus including: a vacuum chamber; a tube housing positioned in the vacuum chamber; a boat in close contact with the tube housing; and heating units positioned adjacent to an outer surface of the boat and an outer surface of the tube housing, respectively, wherein a sublimation purification target material is contained in the boat, and at least one of the boat and the tube housing is formed of a metal.

The boat can include a first boat and a second boat, the first boat and the second boat can be positioned together in the vacuum chamber, and the tube housing can serve as a moving path to allow the sublimation purification target material contained in the first boat to be captured, after being heated, in the second boat.

The heating unit positioned adjacent to the outer surface of the tube housing can include a first heating zone positioned at a portion facing the first boat, a second heating zone positioned between the first boat and the second boat, and a third heating zone positioned at a portion facing the second boat, and the first heating zone can control a temperature so that the sublimation purification target material contained in the first boat and vaporized is maintained in a gas state, the second heating zone can liquefy the vaporized sublimation purification target material, and the third heating zone can control a temperature so that the liquefied sublimation purification target material is maintained in a liquid state to allow the liquefied sublimation purification target material to be deposited dropwise in the second boat.

The tube housing can have a tilted structure along the moving path of the sublimation purification target material.

The metal can be titanium or tantalum.

The sublimation purification apparatus can further include a sealing gasket formed at an end of the tube housing, wherein the sealing gasket can be interposed between the tube housing and the boat.

The sealing gasket can be formed of at least one material selected from the group consisting of titanium (Ti), silver (Ag), copper (Cu), and ceramic.

Another exemplary embodiment of the present invention provides a sublimation purification apparatus including: a chamber moving portion; a plurality of chambers positioned adjacent to the chamber moving portion; a tube housing positioned in each of the chambers; gates positioned between the chamber moving portion and the chambers; a boat moving in the chamber moving portion by a transfer robot, or loaded in the chamber from the chamber moving portion or unloaded from the chamber; and a heating unit surrounding an outer surface of the boat and an outer surface of the tube housing, wherein the boat includes a first boat and a second boat each connected to the tube housing.

The heating unit positioned adjacent to the outer surface of the tube housing can include a first heating zone positioned at a portion facing the first boat, a second heating zone positioned between the first boat and the second boat, and a third heating zone positioned at a portion facing the second boat, and the first heating zone can control a temperature so that a sublimation purification target material contained in the first boat and vaporized is maintained in a gas state, the second heating zone can liquefy the vaporized sublimation purification target material, and the third heating zone can control a temperature so that the liquefied sublimation purification target material is maintained in a liquid state to allow the liquefied sublimation purification target material to be deposited dropwise in the second boat.

The tube housing can have a tilted structure along a moving path of the sublimation purification target material.

The sublimation purification apparatus can further include a vertical transfer device moving at least one of the first boat and the second boat passing through the gate in the chamber to bring the moved boat in close contact with the tube housing.

At least one of the boat and the tube housing can be formed of a metal.

The sublimation purification apparatus can further include a sealing gasket formed at an end of the tube housing, wherein when the boat is loaded in the chamber and is connect to the tube housing, the sealing gasket can be interposed between the boat and the tube housing.

The plurality of chambers can include a first chamber and a second chamber adjacent to each other, the tube housing positioned in the first chamber can heat a sublimation purification target material contained the first boat loaded in the first chamber, removed impurities can be captured in the second boat, the first boat unloaded from the first chamber can be loaded in the second chamber through the chamber moving portion, and the sublimation purification target material contained in the first boat loaded in the second chamber can be melted and vaporized.

The sublimation purification apparatus can further include a sublimation purification amount measurement member fixed in the chamber, wherein the sublimation purification amount measurement member can be positioned under the boat.

The sublimation purification apparatus can further include a vertical transfer device moving at least one of the first boat and the second boat passing through the gate in the chamber to bring the moved boat in close contact with the tube housing.

The boat can be spaced apart from the tube housing and can reach the sublimation purification amount measurement member by the transfer device, and a sublimation purification amount can be measured.

Still another exemplary embodiment of the present invention provides a sublimation purification method including: loading a first boat containing a sublimation purification target material in a first chamber; heating the loaded sublimation purification target material contained in the first boat and capturing removed impurities in a second boat through a tube housing; unloading the first boat from the first chamber and loading the first boat in a second chamber by a transfer robot; melting and vaporizing the sublimation purification target material contained in the first boat loaded in the second chamber; liquefying the vaporized material; capturing the liquefied material in the second boat positioned in the second chamber through the tube housing included in the second chamber; moving the second boat positioned in the second chamber to a cooling chamber by using the transfer robot; and cooling the liquefied material contained in the second boat loaded in the cooling chamber, wherein at least one of the first boat, the second boat, and the tube housing is formed of a metal.

The sublimation purification method can further include cleaning a component, among the first boat, the second boat, and the tube housing, formed of the metal with a chemical solution.

The sublimation purification method can further include baking after the cleaning.

Still another exemplary embodiment of the present invention provides a material for an organic light emitting device purified by the sublimation purification method described above.

Still another exemplary embodiment of the present invention provides an organic light emitting device including the material for an organic light emitting device described above.

Advantageous Effects

According to the exemplary embodiments, quartz used as a material of an inner part of the conventional sublimation purification apparatus is replaced with a metal, such that the disadvantages of quartz are overcome, thereby realizing mass-production of the purified material and improving yield by process continuity.

In addition, the purification of the impurities is performed in the plurality of chambers and the boat moves by the gate and the robot, such that the respective purification processes are clearly divided, thereby improving the high-purity purification efficiency.

In addition, safety accident risk which can occur due to damage of quartz which is the material of the inner part of the conventional sublimation purification apparatus, and degradation of durability degree can be reduced when a sublimation purification operation is performed under high vacuum.

DETAILED DESCRIPTION

Hereinafter, various exemplary embodiments of the present invention will be described in detail with reference to the accompanying drawings so as to be easily realized by those skilled in the art to which the present invention pertains. However, the present invention can be implemented in various different forms and is not limited to the exemplary embodiments described herein.

In addition, throughout the specification, unless described to the contrary, "including" any component will be understood to imply the inclusion of other elements rather than the exclusion of other elements.

In addition, throughout the specification, the phrase "in a plan view" means viewing the object portion from the top, and the phrase "in a cross-sectional view" means viewing a cross-section of which the object portion is vertically cut from the side.

Figure 1:
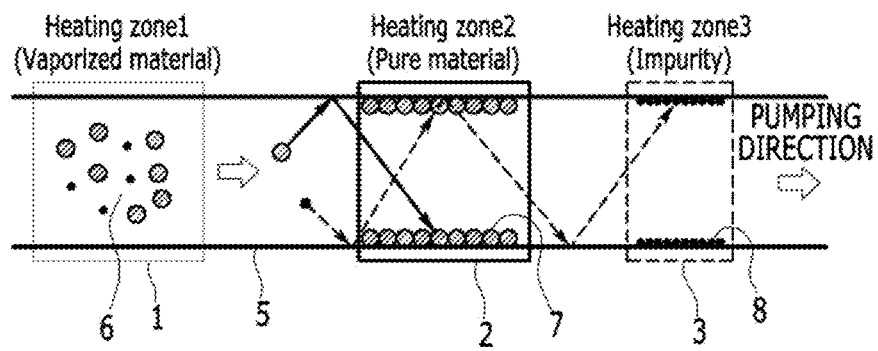
FIG. 1 illustrates a purification principle view of an organic material.
Figure 2:
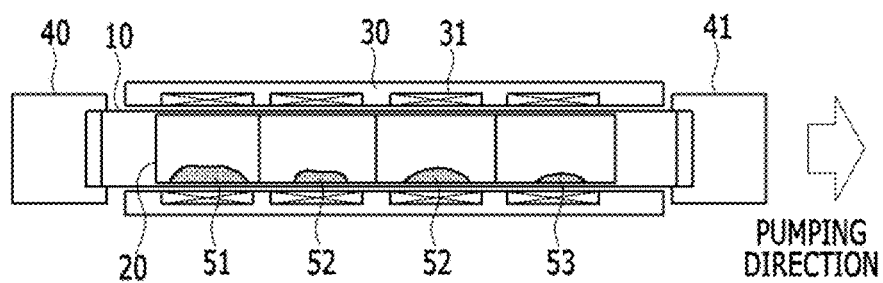
FIG. 2 is a cross-sectional view illustrating a purification apparatus according to the related art.
Figure 3:
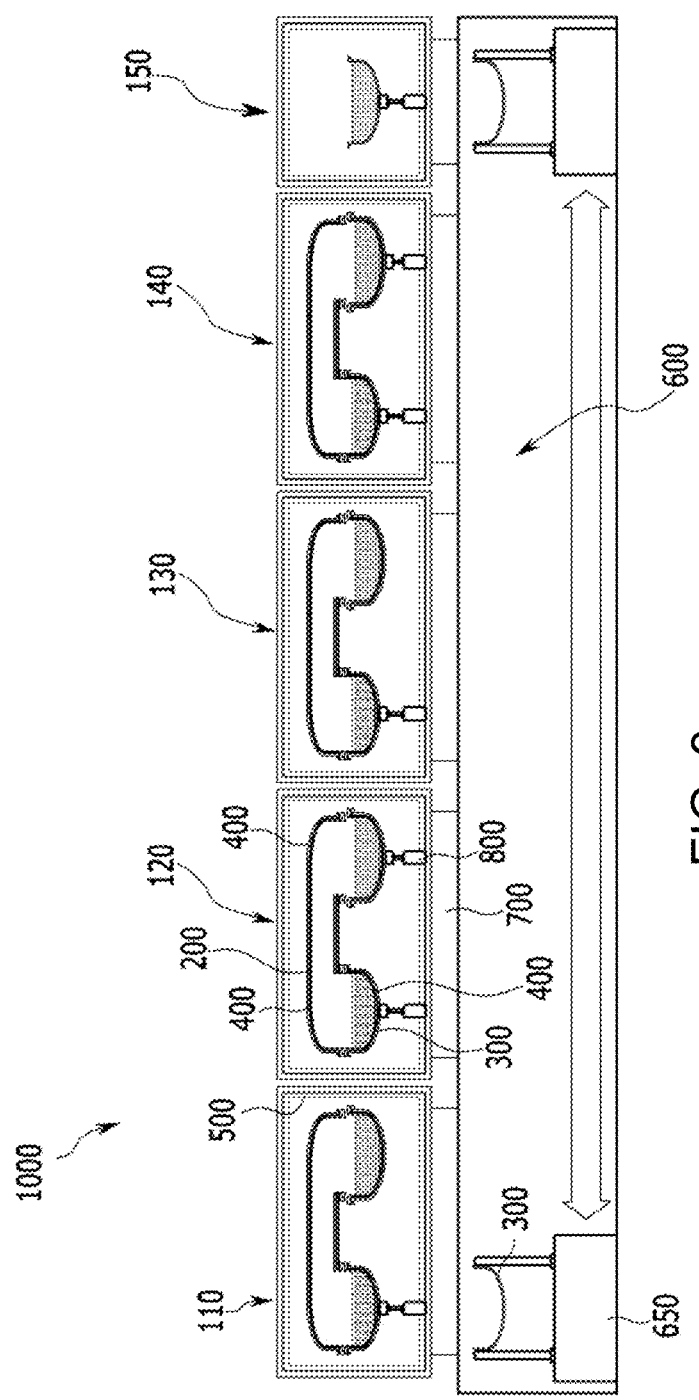
FIG. 3 is a schematic view illustrating a sublimation purification apparatus according to an exemplary embodiment of the present invention.

FIG. 3 is a schematic view illustrating a sublimation purification apparatus according to an exemplary embodiment of the present invention.

Referring to FIG. 3, a sublimation purification apparatus 1000 includes a chamber moving portion 600, a plurality of chambers 110, 120, 130, and 140, and gates 700 positioned between the chamber moving portion 600 and the plurality of chambers 110, 120, 130, and 140. A tube housing 200 is positioned in each of the chambers 110, 120, 130, and 140, and two boats 300 can be connected to each other by the tube housing 200. A sublimation purification process can be performed in a state where the boat 300 is brought in close contact with the tube housing 200. Each of the plurality of chambers 110, 120, 130, and 140 can be a vacuum chamber. It is preferable that the inside of the chamber moving portion 600 also maintains a vacuum state.

The sublimation purification apparatus 1000 includes a heating unit 400 adjacent to an outer surface of the tube housing 200 positioned in each of chambers 110, 120, 130, and 140, and a cooling unit 500 covering the heating unit 400. The heating unit 400 is also formed adjacent to an outer surface of the boat 300.

The sublimation purification apparatus 1000 according to the present exemplary embodiment can further include a cooling chamber 150 in addition to the plurality of chambers 110, 120, 130, and 140, so as to recover a material for an organic light emitting device in the last stage of the sublimation purification process. The cooling chamber 150 can include only the cooling unit 500 without the tube housing 200 positioned in each of the chambers 110, 120, 130, and 140. When the boat 300 containing a purified material passes through the gate 700 by a transfer robot 650 and is loaded in the cooling chamber 150 after the purification process is finished, the purified material in a liquid state is cooled, and the cooling chamber 150 can recover the material for an organic light emitting device to be used as a product.

The transfer robot 650 is positioned in the chamber moving portion 600, the boat 300 moves in the chamber moving portion 600 by the transfer robot 650 or can be loaded in each of the chambers 110, 120, 130, 140, and 150 from the chamber moving portion 600 or unloaded from each of the chambers 110, 120, 130, 140, and 150. When the boat 300 is loaded in each of the chambers 110, 120, 130, 140, and 150 from the chamber moving portion 600 or unloaded from each of the chambers 110, 120, 130, 140, and 150, the boat 300 can pass through the gate 700 positioned between the chamber moving portion 600 and each of the chambers 110, 120, 130, 140, and 150. The boat 300 passing through the gate 700 and loaded in each of the chambers 110, 120, 130, and 140 can be in close contact with the tube housing 200 by a vertical transfer device 800.

At least one of the boat 300 and the tube housing 200 according to the present exemplary embodiment can be formed of a metal. The boat 300 and the tube housing 200 are formed of a material of an inner part of the sublimation purification apparatus 1000. Here, a portion of the boat 300 or the tube housing 200 that is formed of the material of the inner part of the sublimation purification apparatus can be a portion brought in contact with a sublimation purification target material. Here, examples of the metal include titanium, tantalum, alumina, stainless steel, tungsten, silver, copper, invar, and aluminum. Preferably, the metal can be titanium or tantalum. Quartz used in the related art is one of the types of general glass. Quartz has trace impurities because it is mainly consist of only silicon dioxide and is used in a semiconductor, laboratory equipment, an optical component, and the like. Quartz is advantageous in terms of having a light transmitting property, thermal stability, a chemical resistance, and a high-purity quality, but is disadvantageous in terms of poor durability, limitations in machining of components, and low thermal conductivity. Accordingly, in a case where the sublimation purification apparatus is made of quartz, machining is limited in dimension, and when the dimension such as a thickness is increased, it takes long heating time to perform sublimation purification due to low conductivity, and a purified material may not be mass-produced due to inefficiencies of work when assembling and disassembling the apparatus.

As an example of a metal material of the boat, titanium can be used. Titanium has a low metal specific gravity, is light and solid, and is resistant to deformation or corrosion due to excellent corrosion resistance. Therefore, a phase change of a material to be melted is effectively controlled by using a high-strength material, and machining is thus less limited in dimension. As an example of a metal material of the boat, tantalum can be used. Tantalum has excellent ductility, easy processability, and excellent thermal conductivity and electric conductivity.

As an example of a metal material of the tube housing, titanium can be also used. Since titanium has characteristics as described above, it is easily cleaned and thermal transfer is stable, such that a phase thereof is easily changed by precisely controlling a heating condition. Therefore, the material whose phase is changed can easily move between the chambers corresponding to the respective purification zones. As an example of a metal material of the tube housing, tantalum can be also used.

In the first chamber 110 and the third chamber 130 included in the sublimation purification apparatus 1000 according to the present exemplary embodiment, a process of removing outgas and other impurities that are mixed in a material contained in the boat 300 and to be sublimated can be performed. Here, the outgas and the other impurities can be organic impurities mixed in the sublimation purification target material. The outgas is a solvent, such as ethanol, moisture, and hexane, used in a synthesis process which is a stage before the sublimation process. The other impurities can be a monomolecular compound whose molecular weight is lower than that of a good material.

A material to be sublimated is contained in each of the left boats 300 in each of the first chamber 110 and the third chamber 130 illustrated in FIG. 3, and outgas and other impurities cooled after heating is performed in the tube housing 200 are captured in each of the right boats 300 in each of the first chamber 110 and the third chamber 130. Accordingly, a primary sublimated and purified material remains in each of the left boats 300, and the boats 300 containing the primary sublimated and purified material can move to the second chamber 120 and the fourth chamber 140, respectively.

The primary sublimated and purified material is contained in each of the left boats 300 in each of the second chamber 120 and the fourth chamber 140, the material is melted and vaporized while passing through the heating unit 400, the vaporized material is liquefied, and the liquefied material can be captured in the right boat 300 as a sublimated and purified material. The sublimated and purified material captured in each of the right boats 300 in each of the second chamber 120 and the fourth chamber 140 is transferred to the cooling chamber 150 and is subjected to cooling, and then can be recovered as a material for an organic light emitting device.

In other words, the tube housing 200 positioned in the first chamber 110 heats the sublimation purification target material contained a first boat loaded in the first chamber 110, removed impurities are captured in the second boat, the first boat unloaded from the first chamber 110 is loaded in the second chamber 120 through the chamber moving portion 600, the sublimation purification target material contained in the first boat loaded in the second chamber 120 is melted and vaporized, the vaporized material is liquefied, and the liquefied material can be captured in the second boat as a sublimated and purified material.

After the purification processes are sequentially performed in the first chamber 110 and the second chamber 120 described above, in a case where the right boat 300 in the second chamber 120 directly moves to the cooling chamber 150 or an additional sublimation purification process is required, the purification processes sequentially performed in the first chamber 110 and the second chamber 120 can be repeated once again in the third chamber 130 and the fourth chamber 140.

Hereinafter, the tube housing 200, the boat 300, the heating unit 400, and the cooling unit 500 that are positioned in each of the chambers 110, 120, 130, and 140 and related to a sublimation purification path will be described in detail with reference to FIGS. 4 to 7.

Figure 4:
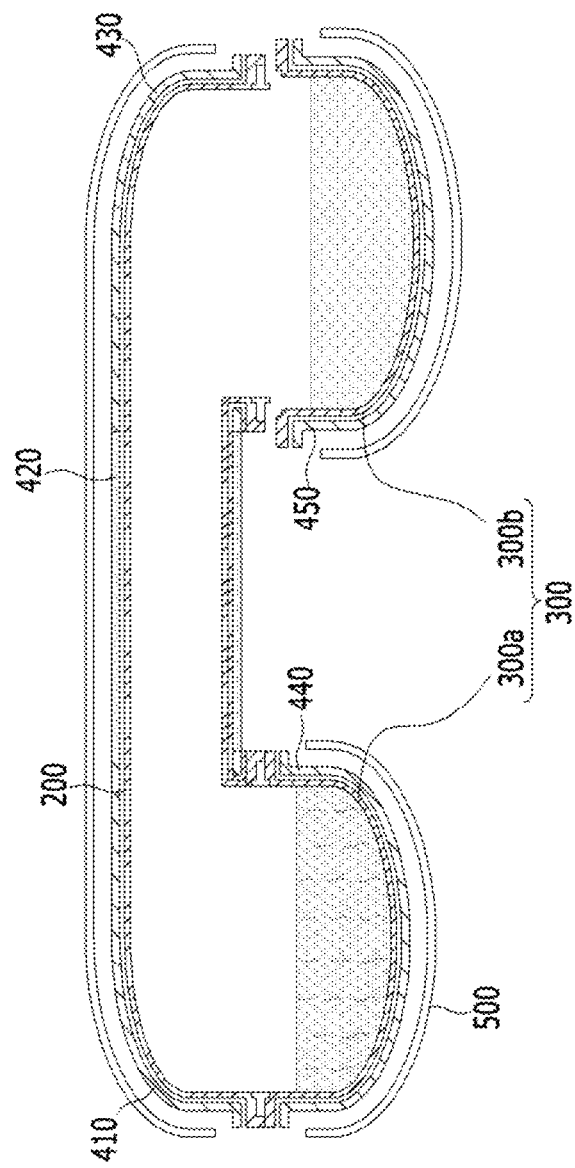
FIG. 4 is an enlarged view illustrating a state in which a tube housing and a boat that are positioned in one chamber are in close contact with each other in the sublimation purification apparatus of FIG. 3.
Figure 5:
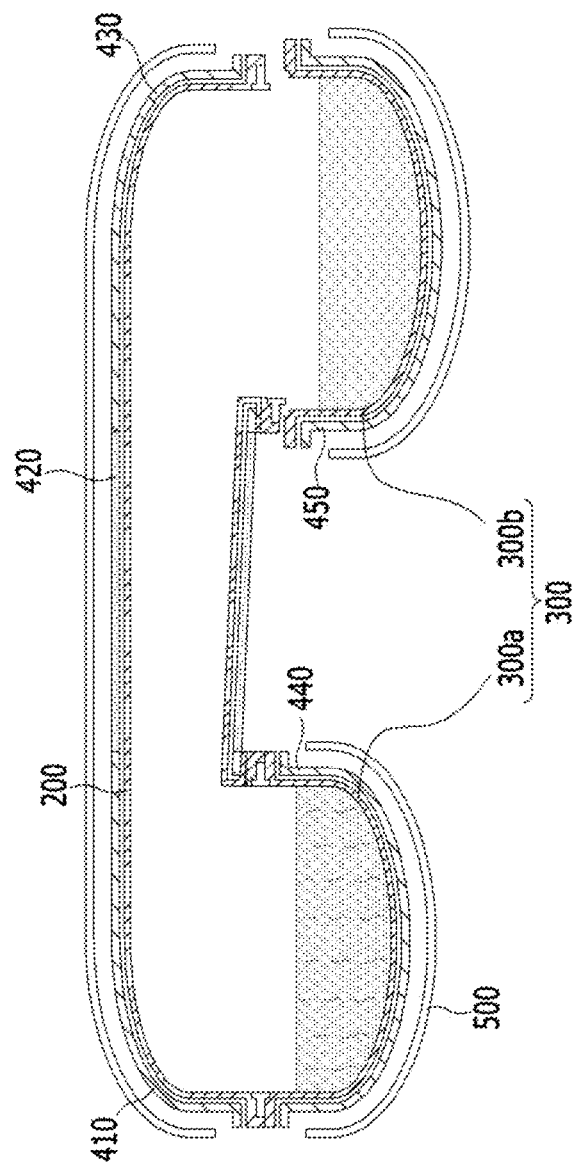
FIG. 5 is a view illustrating a modified exemplary embodiment in which a part of the tube housing has a tilted structure in the sublimation purification apparatus of FIG. 4.
Figure 6:
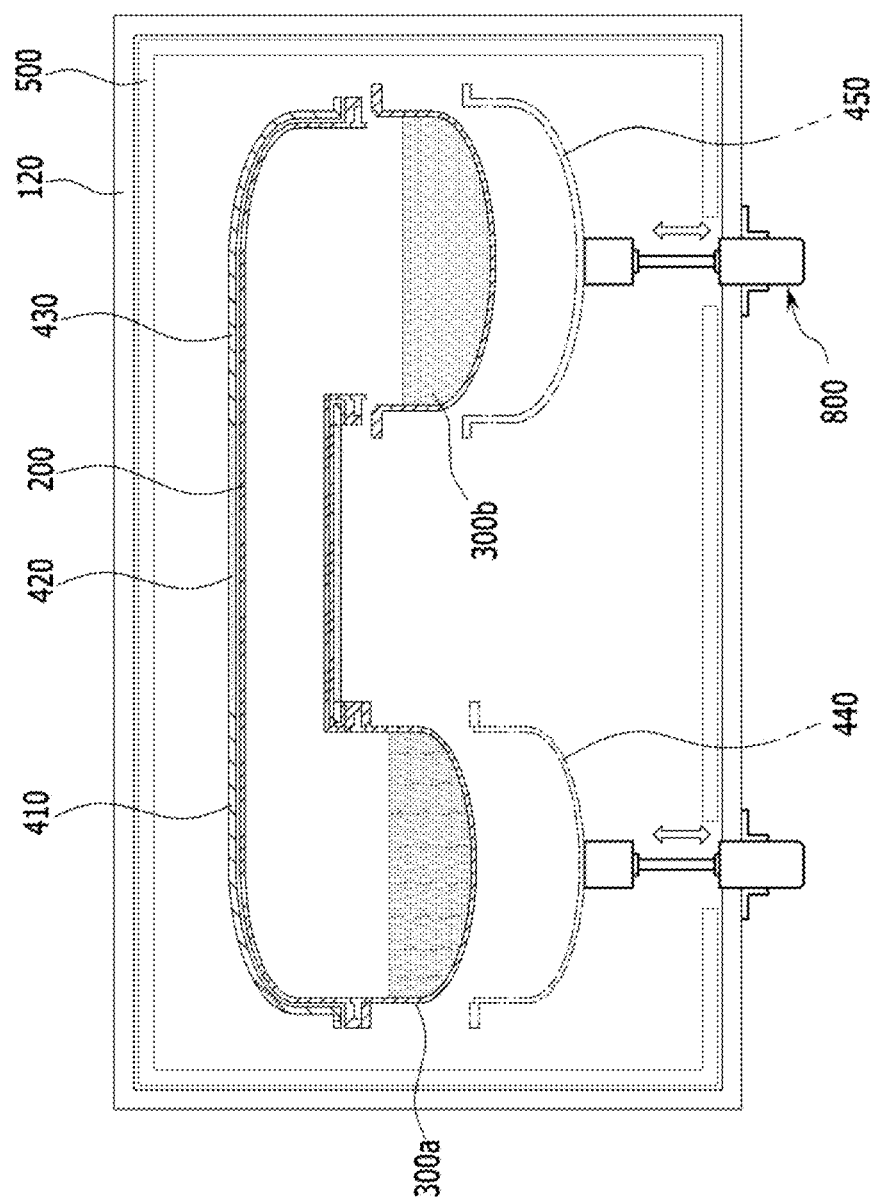
FIG. 6 is a view illustrating a process of loading boats in a chamber into the sublimation purification apparatus of FIG. 3.
Figure 7:
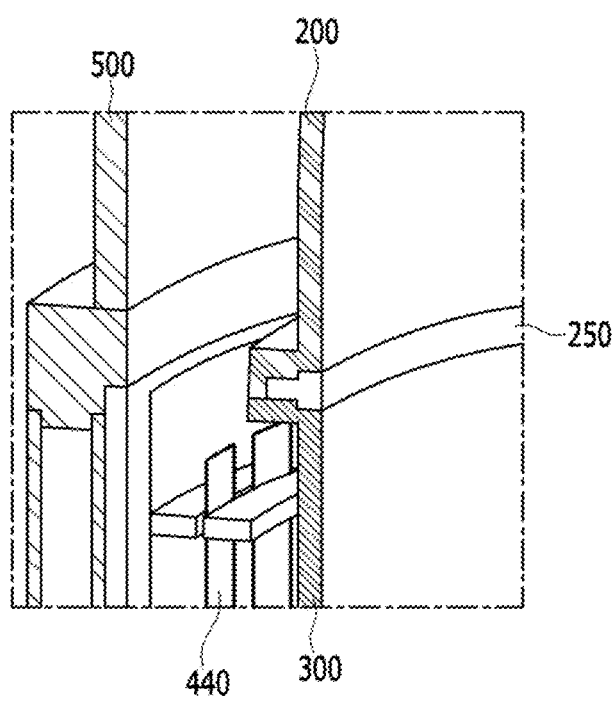
FIG. 7 is a perspective view illustrating the state in which the tube housing and the boat are in close contact with each other in FIG. 4.

FIG. 4 is an enlarged view illustrating a state in which a tube housing and a boat that are positioned in one chamber are in close contact with each other in the sublimation purification apparatus of FIG. 3. FIG. 5 is a view illustrating a modified exemplary embodiment in which a part of the tube housing has a tilted structure in the sublimation purification apparatus of FIG. 4. FIG. 6 is a view illustrating a process of loading boats into a chamber in the sublimation purification apparatus of FIG. 3. FIG. 7 is a perspective view illustrating the state in which the tube housing and the boat are in close contact with each other in FIG. 4.

Referring to FIG. 4, in the present exemplary embodiment, the tube housing 200 can be served as a moving path of the sublimation purification target material to allow the sublimation purification target material contained in a first boat 300a to be captured in a second boat 300b after being heated. The sublimation purification target material can be a mixed material in which an organic material and impurities are mixed.

The heating unit 400 positioned adjacent to the outer surface of the tube housing 200 according to the present exemplary embodiment includes: a first heating zone 410 positioned at a portion facing the first boat 300a; a second heating zone 420 positioned between the first boat 300a and the second boat 300b; and a third heating zone 430 positioned at a portion facing the second boat 300b. The sublimation purification target material contained in the first boat 300a is liquefied after being heated by a lower heating unit 440 positioned under the first boat 300a, and the liquefied sublimation purification target material is vaporized by an additional temperature increase, and the vaporized sublimation material reaches the first heating zone 410 of the tube housing 200 and then moves to the second heating zone 420 whose temperature is lowest. At this time, the first heating zone 410 maintains the same temperature as that of the first boat 300a so that the vaporized sublimation material flies to the second heating zone 420 while maintaining a gas state.

The second heating zone 420 lowers the temperature, such that a phase of the vaporized sublimation purification target material can be changed to a liquid state. The second heating zone 420 can also have a cooling function in order to control a phase change between materials caused by excessive thermal interference of the first heating zone 410. The material liquefied in the second heating zone 420 enters the third heating zone 430. The third heating zone 430 controls the temperature so that the temperature of the liquid state of the liquefied sublimation purification target material can be maintained. The sublimation purification target material passes through the third heating zone 430 and then is deposited dropwise in the second boat 300b in the liquid state. In this case, as a modified exemplary embodiment, as illustrated in FIG. 5, the tube housing 200 can have a tilted structure along the moving path of the sublimation purification target material. The material can smoothly move from the first boat 300a to the second boat 300b by the tilted structure. The tilted structure is provided to allow the liquefied sublimation purification target material to smoothly flow to the second boat 300b. The degree of tilt can be about 5 degrees.

Referring to FIG. 6, the boat 300 passing through the gate 700 and loaded in the chamber 120 in FIG. 3 can be in close contact with the tube housing 200 by the vertical transfer device 800. The vertical transfer device 800 can serve to move the boat 300 in the chamber 120 by bringing the loaded boat 300 in close contact with the tube housing 200 positioned in the chamber 120 so that the sublimation purification process can be performed.

The vertical transfer device 800 can be a pneumatic cylinder. The first boat 300*a* can be mounted in the second chamber 120 by the transfer robot 650 described in FIG. 3 in a state where the lower heating units 440 and 450 mounted under the first boat 300*a* are lowered by the vertical transfer device 800. And then, the lower heating units 440 and 450 are lifted toward the tube housing 200 by using the vertical transfer device 800 in a state where a vacuum atmosphere is created after closing the gate, such that the first boat 300*a* loaded in the second chamber 120 can be closely contacted with the tube housing 200 by a physical force. The first boat 300*a* and the tube housing 200 are closely contacted with each other, such that contamination from the outside which can occur when the vaporized material is leaked from a gap between the first boat 300*a* and the tube housing 200 can be prevented.

On the other hand, the second boat 300*b* is present in a state of being separated from the tube housing 200, and the sublimation is performed while the first boat 300*a* and the tube housing 200 are maintained in a closely contacted state. At this time, the second boat 300*b* collects the liquefied material in the state of being separated from the tube housing 200. Specifically, the liquefied material can be collected in the second boat 300*b* by a phenomenon in which the liquefied material is deposited dropwise from above by a tilted angle according to the tilted structure of the tube housing 200. In addition, since the second chamber 120 and the second boat 300*b* are separated from each other, an internal pressure of the second chamber 120 can be maintained to be equal to an internal pressure of the tube housing 200.

Referring to FIG. 7, the sublimation purification apparatus according to the present exemplary embodiment can further include a sealing gasket 250 interposed between the boat 300 and the tube housing 200 in a case where the boat 300 and the tube housing 200 are in close contact with each other. The sealing gasket 250 is formed at an end of the tube housing 200. The sealing gasket 250 fills a narrow gap generated at a portion at which the end of the tube housing 200 is bent. The sealing gasket 250 can be formed of at least one material selected from the group consisting of titanium (Ti), silver (Ag), copper (Cu), and ceramic.

A solid becomes a liquid when being heated in the chamber 120, and the sealing gasket 250 can prevent the liquid from being leaked from the tube housing.

Figure 8:
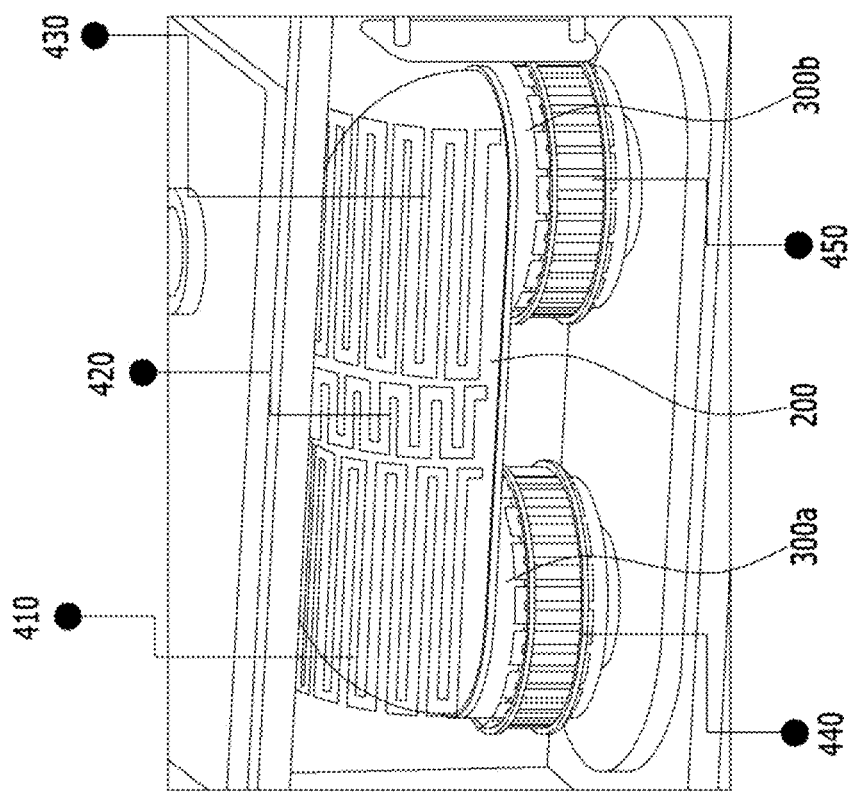
FIG. 8 is a perspective view illustrating a heating unit according to an exemplary embodiment of the present invention.

Hereinafter, the heating unit will be described in detail with reference to FIG. 8. FIG. 8 is a perspective view illustrating a heating unit according to an exemplary embodiment of the present invention.

Referring to FIG. 8, the tube housing 200 has a bath shape and can have an inverted bath structure. The first boat 300*a* and the second boat 300*b* are in close contact with both edges of the tube housing 200, respectively.

The heating unit according to the present exemplary embodiment includes an upper heating unit positioned adjacent to the outer surface of the tube housing 200 and lower heating units positioned adjacent to the outer surfaces of the first and second boats 300*a* and 300*b*, respectively. The upper heating unit includes the first heating zone 410 positioned at a portion facing the first boat 300*a*; the second heating zone 420 positioned between the first boat 300*a* and the second boat 300*b*; and the third heating zone 430 positioned at a portion facing the second boat 300*b*. The lower heating unit includes a fourth heating zone 440 surrounding a side surface of the first boat 330*a* and a fifth heating zone 450 surrounding a side surface of the second boat 330*b*.

The heating unit according to the present exemplary embodiment can be formed of tantalum. Since tantalum has excellent ductility, easy processability, and excellent thermal conductivity and electric conductivity, heat can be individually transferred in the heating zone to be heated and heat transfer control can be very stable. Alternatively, the heating unit can be formed of Inconel. Inconel has an excellent heat-resistance property, is inoxidizable even under an oxidizing condition such as about 900° C., and has excellent properties such as elongation, a tensile strength, and a yield point, that are not easily changed up to 600° C.

Figure 9:
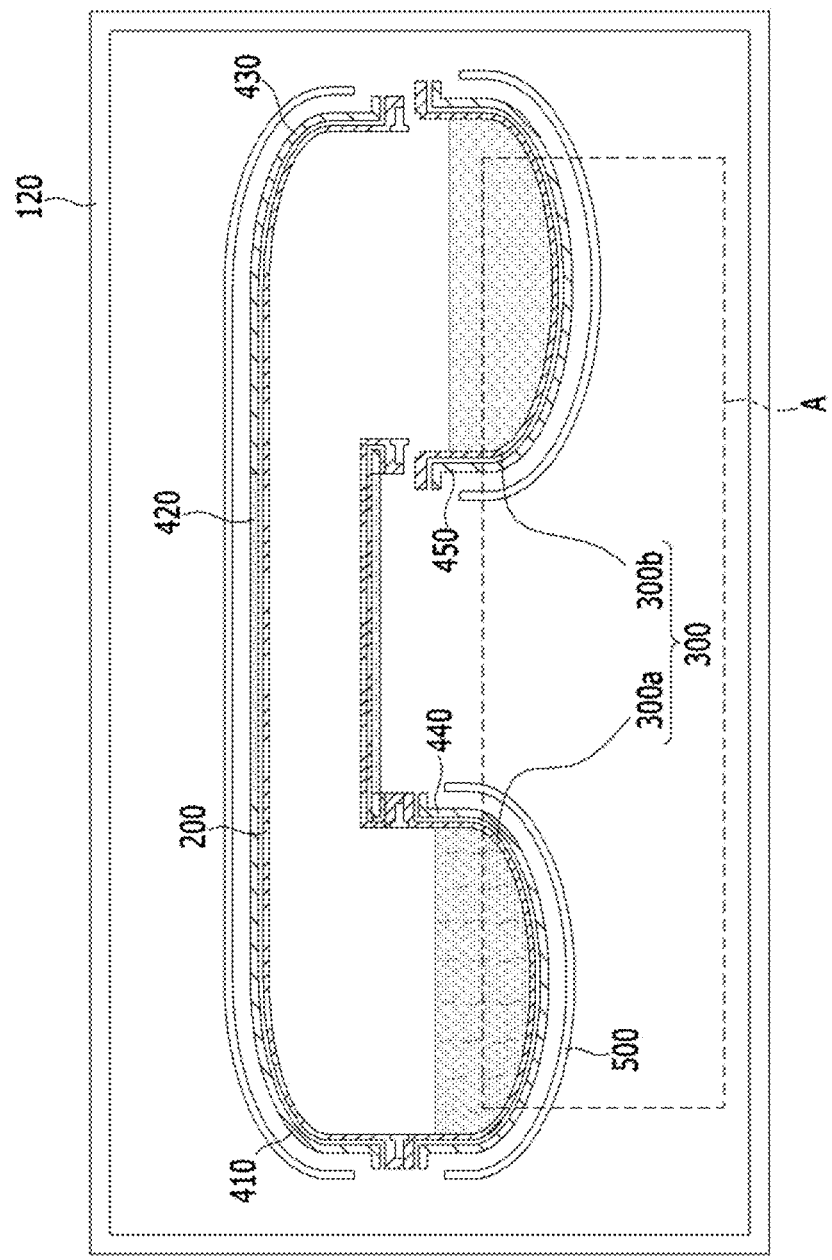
FIG. 9 is a view illustrating a state in which a boat is brought in close contact with a tube housing in one chamber of a sublimation purification apparatus according to another exemplary embodiment of the present invention.
Figure 10:
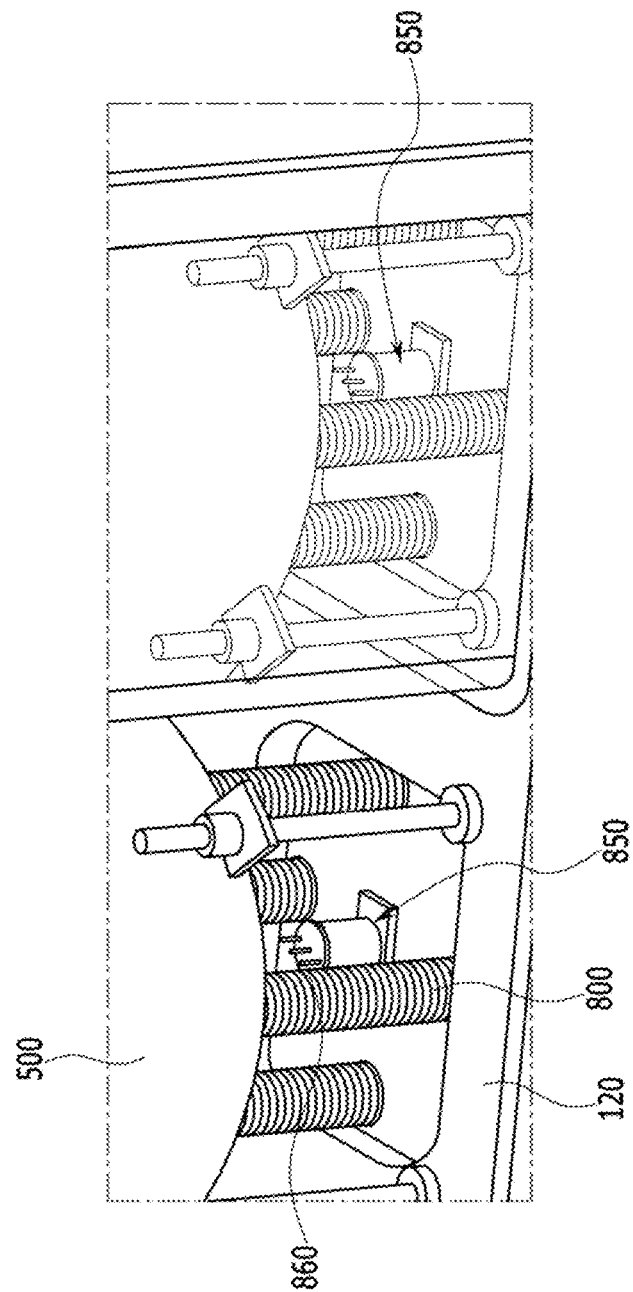
FIG. 10 is a perspective view illustrating a vertical transfer device and a sublimation purification amount measurement member of A portion of FIG. 9.
Figure 11:
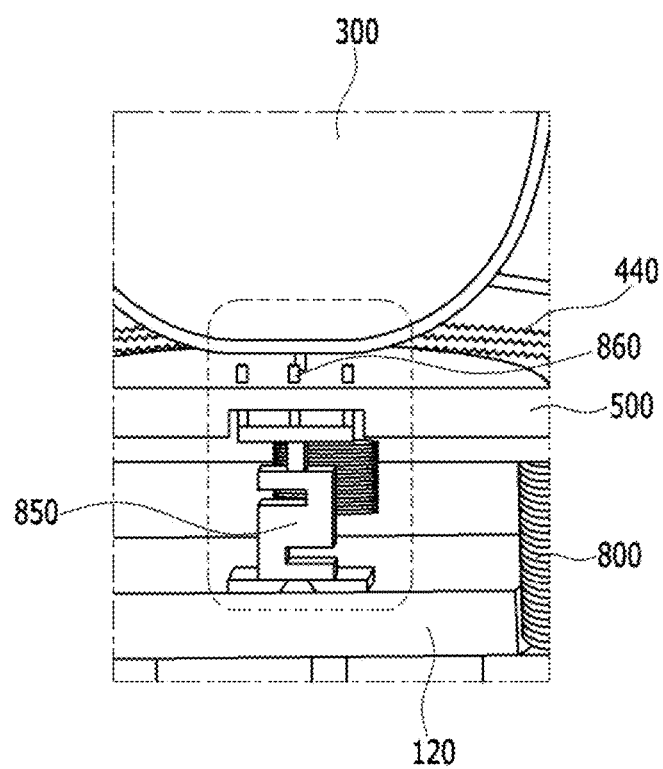
FIG. 11 is a front view illustrating the sublimation purification amount measurement member of FIG. 10.

FIG. 9 is a view illustrating a state in which a boat is brought in close contact with a tube housing in one chamber of a sublimation purification apparatus according to another exemplary embodiment of the present invention. FIG. 10 is a perspective view illustrating a vertical transfer device and a sublimation purification amount measurement member of A portion of FIG. 9. FIG. 11 is a front view illustrating the sublimation purification amount measurement member of FIG. 10.

Referring to FIGS. 9 and 10, the sublimation purification apparatus according to the present exemplary embodiment further includes a sublimation purification amount measurement member 850 fixed in the chamber 120. The sublimation purification amount measurement member 850 can be positioned under the boat 300. As such, the sublimation purification amount measurement member 850 is positioned under the boat 300, such that the sublimation purification amount can be checked in real time when the sublimation purification process is performed. The sublimation purification amount measurement member 850 which is a weight sensor is a converter for measuring a force or a weight and a device capable of outputting an output into an electrical signal.

Specifically, referring to FIG. 11, although a heating unit 440 which is a heating unit positioned under the boat 300 surrounds the boat 300, a tripod-shaped pin 860 protrudes from the sublimation purification amount measurement member 850 according to the present exemplary embodiment at a position of the lower central portion of the heating unit 440 at which the pin is not interfered with the heating unit 440. The heating unit 440 can be a wire-type heating line. A plurality of heating lines are formed with intervals and have a form entirely surrounding the tube housing 200 as illustrated in FIG. 9. In other words, since the tripod-shaped pin 860 protrudes upwards between the plurality of heating lines, the boat 300 and the sublimation purification amount measurement member 850 can be assembled without interference of the heating unit 440.

When the boat 300 moves downwards by the vertical transfer device 800 supporting the boat 300, the boat 300 reaches the pin 860 of the sublimation purification amount measurement member 850. At this time, the purification amount of sublimated and purified material in the boat 300 can be measured.

In the related art, a process condition and a process finish point can be subjectively determined from the experiences after simply checking sublimation purification amount with naked eyes. On the other hand, in the sublimation purification apparatus according to the present exemplary embodiment, since it is possible to check a movement amount of material and a consumption amount of material in real time by using the sublimation purification amount measurement member 850 when the process is being performed, a deviation between processes and problems which can occur in the process can be minimized.

Hereinafter, a sublimation purification method according to another exemplary embodiment of the present invention will be described with reference to FIGS. 3 to 8 again.

Referring to FIGS. 3 to 8, in the sublimation purification method according to the present exemplary embodiment, the first boat 300*a* containing the sublimation purification target material is loaded in the first chamber 110 and is subjected to heating, and then the outgas and impurities that are mixed in the sublimation purification target material is primarily removed. At this time, a residual solvent and monomolecular impurities in addition to the purified material are primarily sublimated and then captured in the second boat 300*b*. Next, cooling is performed up to a temperature at which the material is not sublimated, that is, a temperature having a range in which the material is not vaporized.

Next, the first boat 300*a* containing the primary purified material is unloaded from the first chamber 110 and then is loaded in the second chamber 120 by the transfer robot 650. The sublimation purification target material contained in the first boat 300*a* loaded in the second chamber 120 is liquefied after being heated by the fourth heating zone 440, and the liquefied material is vaporized by an additional temperature increase. The vaporized sublimation material moves to the first heating zone 410, and the first heating zone 410 maintains the same temperature as that of the first boat 300*a* so that the vaporized sublimation material can fly to the second heating zone 420. The second heating zone 420 lowers temperature to liquefy the vaporized sublimation purification target material. The material liquefied in the second heating zone 420 enters the third heating zone 430. The temperature of the liquid state of the liquefied sublimation purification target material is maintained by controlling the third heating zone 430 and the liquefied sublimation purification target material is captured by being deposited dropwise in the second boat 330*b* in a liquid state. After the process in the second chamber 120 is finished, the second boat 300*b* moves to the cooling chamber 150 by using the transfer robot 650, and the liquefied material contained in the second boat 300*b* loaded in the cooling chamber 150 can be cooled.

When the sublimation purification process is performed, in order to obtain the high-purity purified material before loading the second boat 300*b* in the cooling chamber 150, the same processes sequentially performed in the first chamber 110 and the second chamber 120 can be repeatedly performed in the chamber 130 and the fourth chamber 140.

The first boat 300*a*, the second boat 300*b*, and the tube housing 200 are formed of a metal, and the sublimation purification method according to the present exemplary embodiment can further include cleaning of a component formed of the metal with a chemical solution. Through such a cleaning, it is possible to prevent problems such as an increase in voltage and lifetime shortening when manufacturing the organic light emitting device, caused by the metal impurities eluted from the metal material forming the heating unit and the tube housing and mixed in the sublimation purification target material, in high vacuum.

The sublimation purification method according to the present exemplary embodiment can further include baking after the cleaning. The baking can be performed at a temperature of about 200° C. or higher and can be performed at least twice.

Although preferred exemplary embodiments of the present invention have been described in detail hereinabove, the scope of the present invention is not limited thereto, but can include several modifications and alterations made by those skilled in the art using a basic concept of the present invention as defined in the claims.

DESCRIPTION OF SYMBOLS

1000: Sublimation purification apparatus
110, 120, 130, 140: Chamber
150: Cooling chamber
200: Tube housing
250: Sealing gasket
300: Boat
400: Heating unit
410, 420, 430, 440, 450: Heating zone
500: Cooling unit
600: Chamber moving portion
650: Transfer robot
700: Gate
800: Vertical transfer device
850: Sublimation purification amount measurement member
1: Heating zone 1
2: Heating zone 2
3: Heating zone 3
5: Quartz tube
6: Organic material
7: Purified material
8: Impurities
10: First quartz tube
20: Second quartz tube
30: Heater cover
31: Ceramic heater
51: Organic material
52: Purified material
53: Impurities

The invention claimed is:

1. A sublimation purification apparatus comprising:
a vacuum chamber;
a tube housing positioned in the vacuum chamber;
  a boat in close contact with the tube housing; and
heating units positioned adjacent to an outer surface of the boat and an outer surface of the tube housing, respectively,
wherein a sublimation purification target material is contained in the boat, and at least one of the boat and the tube housing is formed of a metal,
the boat includes a first boat and a second boat, the first boat and the second boat are positioned together in the vacuum chamber, and the tube housing serves as a moving path to allow the sublimation purification target material contained in the first boat to be captured in the second boat after being heated.

2. The sublimation purification apparatus of claim 1, wherein:
at least one of the boat and the tube housing is formed of titanium or tantalum.

3. The sublimation purification apparatus of claim 2, wherein:
the heating unit positioned adjacent to the outer surface of the tube housing includes a first heating zone positioned at a portion facing the first boat, a second heating zone positioned between the first boat and the second boat, and a third heating zone positioned at a portion facing the second boat, and the first heating zone controls a temperature so that the sublimation purification target material contained in the first boat and vaporized is maintained in a gas state, the second heating zone liquefies the vaporized sublimation purification target material, and the third heating zone controls a temperature so that the liquefied sublimation purification target material is maintained in a liquid state to allow the liquefied sublimation purification target material to be deposited dropwise in the second boat.

4. The sublimation purification apparatus of claim 3, wherein:
the tube housing has a tilted structure along the moving path of the sublimation purification target material.

5. The sublimation purification apparatus of claim 1, further comprising:
a sealing gasket formed at an end of the tube housing, wherein the sealing gasket is interposed between the tube housing and the boat.

6. The sublimation purification apparatus of claim 5, wherein:
the sealing gasket is formed of at least one material selected from the group consisting of titanium (Ti), silver (Ag), copper (Cu), and ceramic.

7. A sublimation purification apparatus comprising:
a chamber moving portion;
a plurality of chambers positioned adjacent to the chamber moving portion;
a tube housing positioned in each of the chambers;
gates positioned between the chamber moving portion and the chambers;
a boat moving in the chamber moving portion by a transfer robot, or loaded in the chamber from the chamber moving portion or unloaded from the chamber; and
a heating unit surrounding an outer surface of the boat and an outer surface of the tube housing,
wherein:
the boat includes a first boat and a second boat each connected to the tube housing; and
at least one of the boat and the tube housing is formed of titanium or tantalum.

8. The sublimation purification apparatus of claim 7, wherein:
the heating unit positioned adjacent to the outer surface of the tube housing includes a first heating zone positioned at a portion facing the first boat, a second heating zone positioned between the first boat and the second boat, and a third heating zone positioned at a portion facing the second boat, and
the first heating zone controls a temperature so that a sublimation purification target material contained in the first boat and vaporized is maintained in a gas state, the second heating zone liquefies the vaporized sublimation purification target material, and the third heating zone controls a temperature so that the liquefied sublimation purification target material is maintained in a liquid state to allow the liquefied sublimation purification target material to be deposited dropwise in the second boat.

9. The sublimation purification apparatus of claim 8, wherein:
the tube housing has a tilted structure along a moving path of the sublimation purification target material.

10. The sublimation purification apparatus of claim 9, further comprising:
a vertical transfer device moving at least one of the first boat and the second boat passing through the gate in the chamber to bring the moved boat in close contact with the tube housing.

11. The sublimation purification apparatus of claim 7, further comprising:
a sealing gasket formed at an end of the tube housing, wherein when the boat is loaded in the chamber and is connect to the tube housing, the sealing gasket is interposed between the boat and the tube housing.

12. The sublimation purification apparatus of claim 7, wherein:
the plurality of chambers include a first chamber and a second chamber adjacent to each other,
the tube housing positioned in the first chamber heats a sublimation purification target material contained the first boat loaded in the first chamber, removed impurities are captured in the second boat, the first boat unloaded from the first chamber is loaded in the second chamber through the chamber moving portion, and the sublimation purification target material contained in the first boat loaded in the second chamber is melted and vaporized.

13. A sublimation purification method comprising:
loading a first boat containing a sublimation purification target material in a first chamber;
heating the loaded sublimation purification target material contained in the first boat and capturing removed impurities in a second boat through a tube housing;
unloading the first boat from the first chamber and loading the first boat in a second chamber by a transfer robot;
melting and vaporizing the sublimation purification target material contained in the first boat loaded in the second chamber;
liquefying the vaporized material;
capturing the liquefied material in the second boat positioned in the second chamber through the tube housing included in the second chamber;
moving the second boat positioned in the second chamber to a cooling chamber by using the transfer robot; and
cooling the liquefied material contained in the second boat loaded in the cooling chamber,
wherein at least one of the first boat, the second boat, and the tube housing is formed of a metal.

14. The sublimation purification method of claim 13, further comprising:
cleaning a component, among the first boat, the second boat, and the tube housing, formed of the metal with a chemical solution; and
baking the component after the cleaning.

15. The sublimation purification apparatus of claim 1, further comprising:
a sublimation purification amount measurement member fixed in the chamber,
wherein the sublimation purification amount measurement member is positioned under the boat.

16. The sublimation purification apparatus of claim 7, further comprising:
a sublimation purification amount measurement member fixed in the chamber,
wherein the sublimation purification amount measurement member is positioned under the boat.

17. The sublimation purification apparatus of claim 16, further comprising:

a vertical transfer device moving at least one of the first boat and the second boat passing through the gate in the chamber to bring the moved boat in close contact with the tube housing.

18. The sublimation purification apparatus of claim 17, wherein:

the boat is spaced apart from the tube housing and reaches the sublimation purification amount measurement member by the transfer device, and a sublimation purification amount is measured.

* * * * *